US008236693B2

(12) United States Patent
Yu et al.

(10) Patent No.: US 8,236,693 B2
(45) Date of Patent: Aug. 7, 2012

(54) METHODS OF FORMING SILICIDES OF DIFFERENT THICKNESSES ON DIFFERENT STRUCTURES

(75) Inventors: Wen Yu, Freemont, CA (US); Paul Besser, Sunnyvale, CA (US); Bin Yang, Chappaqua, NY (US); Haijiang Yu, Sunnyvale, CA (US); Simon S. Chan, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 937 days.

(21) Appl. No.: 11/748,743

(22) Filed: May 15, 2007

(65) Prior Publication Data
US 2008/0286921 A1    Nov. 20, 2008

(51) Int. Cl.
*H01L 21/44* (2006.01)

(52) U.S. Cl. ........ 438/682; 438/210; 438/655; 438/660; 438/761

(58) Field of Classification Search ................. 438/210, 438/655, 660, 682, 687, 761, 942, FOR. 187, 438/FOR. 220
See application file for complete search history.

(56) References Cited

U.S. PATENT DOCUMENTS

| 6,420,273 | B1 * | 7/2002 | Lin | 438/706 |
| 2007/0059931 | A1 * | 3/2007 | Park et al. | 438/682 |
| 2007/0131930 | A1 * | 6/2007 | Aida et al. | 257/48 |
| 2007/0296052 | A1 * | 12/2007 | Lee et al. | 257/478 |

* cited by examiner

*Primary Examiner* — N Drew Richards
*Assistant Examiner* — Joannie A Garcia
(74) *Attorney, Agent, or Firm* — Meyertons, Hood, Kivlin, Kowert & Goetzel, P.C.

(57) ABSTRACT

The gate and active regions of a device are formed and alternating steps of applying and removing nitride and oxide layers allows exposing silicon in different areas while keeping silicon or polysilicon in other area covered with nitride. Metal layers are deposited over the exposed silicon or polysilicon and annealing forms a silicide layer in the selected exposed areas. The oxide and/or nitride layers are removed from the covered areas and another metal layer is deposited. The anneal process is repeated with silicide of one thickness formed over the second exposed areas with additional thickness of silicide formed over the previous silicide thickness.

15 Claims, 9 Drawing Sheets

METHODS OF FORMING SILICIDES OF DIFFERENT THICKNESSES ON DIFFERENT STRUCTURES

TECHNICAL FIELD

The present invention relates to semiconductor processes and in particular to processes for forming different thicknesses of suicides on different structures.

BACKGROUND INFORMATION

In semiconductor device fabrication, the various processing steps fall into four general categories: deposition, removal, patterning, and modification of electrical properties. Deposition is any process that grows, coats, or otherwise transfers a material onto the wafer. Available technologies consist of physical vapor deposition (PVD), chemical vapor deposition (CVD), electrochemical deposition (ECD), molecular beam epitaxy (MBE) and more recently, atomic layer deposition (ALD) among others. Removal processes are any that remove material from the wafer either in bulk or selective form and consist primarily of etch processes, both wet etching and dry etching such as reactive ion etch (RIE). Chemical-mechanical planarization (CMP) is also a removal process used between levels. Patterning covers the series of processes that shape or alter the existing shape of the deposited materials and is generally referred to as lithography. For example, in conventional lithography, the wafer is coated with a chemical called a "photoresist." The photoresist is exposed by a "stepper," a machine that focuses, aligns, and moves the mask, exposing select portions of the wafer to short wavelength light. The unexposed regions are washed away by a developer solution. After etching or other processing, the remaining photoresist may be removed by plasma ashing.

Modification of electrical properties has historically consisted of doping transistor sources and drains, originally by diffusion furnaces and later by ion implantation. These doping processes are followed by furnace anneal, or in advanced devices, by rapid thermal anneal (RTA), which serve to activate the implanted dopants. Modification of electrical properties now also extends to reduction of dielectric constant in low-k insulating materials via exposure to ultraviolet light in UV processing (UVP).

Many modern chips have eight or more levels produced in over 300 sequenced processing steps. The raw wafer is engineered by at minimum, growth of an ultra-pure, defect-free silicon surface through epitaxy. In the most advanced logic devices, prior to silicon epitaxy, tricks are performed to improve the performance of the transistors to be built. One method involves introducing a "straining step" wherein a silicon variant such as "silicon-germanium" (SiGe) is deposited. Once the epitaxial silicon is deposited, the crystal lattice becomes stretched somewhat, resulting in improved electronic mobility. Another method, called "silicon on insulator" technology involves the insertion of an insulating layer between the raw silicon wafer and the thin layer of subsequent silicon epitaxy. This method results in the creation of more idealized transistors with minimized parasitic effects.

Front end surface engineering is followed by: growth of the gate dielectric, traditionally silicon dioxide ($SiO_2$), patterning of the gate, patterning of the source and drain regions, and subsequent implantation or diffusion of dopants to obtain the desired complimentary electrical properties. In memory devices, storage cells (conventionally capacitors) are also fabricated at this time, either into the silicon surface or stacked above the transistor.

Once the various semiconductor devices have been created, they must be interconnected to form the desired electrical circuits. This process involves creating metal interconnecting wires that are isolated by insulating materials often referred to in the industry as dielectrics. The insulating material was traditionally a form of $SiO_2$ or a silicate glass, but recently new low dielectric constant materials are being used. These dielectrics presently have dielectric constants around 2.7, although materials with constants as low as 2.2 are being offered to chipmakers.

Historically, the metal wires consisted of aluminum. In this approach to wiring often called "subtractive aluminum," blanket films of aluminum are deposited first, patterned, and then etched, leaving isolated wires. Dielectric material is then deposited over the exposed wires. The various metal layers are interconnected by etching holes, called "vias," in the insulating material and depositing tungsten in them with a chemical vapor deposition (CVD) technique. This approach is still used in the fabrication of many memory chips such as dynamic random access memory (DRAM) as the number of interconnect levels is small, currently no more than four.

More recently, as the number of interconnect levels for logic has substantially increased due to the large number of transistors that are now interconnected in a modern microprocessor, the timing delay in the wiring has become significant prompting a change in wiring material from aluminum to copper and from the aforementioned silicon dioxides to newer low-K materials. This performance enhancement also comes at a reduced cost via "damascene" processing that eliminates processing steps. In damascene processing, in contrast to subtractive aluminum technology, the dielectric material is deposited first as a blanket film and is patterned and etched leaving holes or trenches. In "single damascene" processing, copper is then deposited in the holes or trenches surrounded by a thin barrier film resulting in filled vias or wire "lines" respectively. In "dual damascene" technology, both the trench and via are fabricated before the deposition of copper resulting in formation of both the via and line simultaneously, further reducing the number of processing steps. The thin barrier film, called Copper Barrier Seed (CBS), is a necessary evil to prevent copper diffusion into the dielectric. As the presence of excessive barrier film competes with the available copper wire cross section, formation of the thinnest yet continuous barrier represents one of the greatest ongoing challenges in copper processing.

Current doping processes require photoresist or some other type of blocking layer to place dopant in only the desired regions of an IC wafer. Patterning of the photoresist or other type of blocking layer typically requires lithography steps before implantation and removal steps after implantation. In addition to adding considerable time to the overall process flow, lithography steps are expensive and the required removal steps may affect the overall process integration, for example, by removing finite amounts of field oxide.

Metal silicide thin films are integral parts of all microelectronics devices. They have been used as ohmic contacts, Schottky barrier contacts, gate electrodes, local interconnects, and diffusion barriers. With advances in semiconductor device fabrication technology, the shrinkage in line width continues at a fast pace. In the 90 nm generation devices produced in 2005, the gate length and thickness of silicide at the contact window were 32 nm and 20 nm, respectively. In the year 2007, it is predicted that for the 65 nm generation devices these numbers will decrease to 25 nm and 17 nm, respectively.

In addition, more transistors will be incorporated in one chip. However, owing to the demand for increased integration level, the surface area will not be adequate to meet the interconnect demand. Multi-level interconnections provide flexibility in circuit design and a substantial reduction in die size and, thus, chip cost.

For metallization of integrated circuit (IC) devices, transition metal suicides, including near-noble and refractory metal silicides, are used. The general requirements are: low resistivity; good adhesion to silicon; low contact resistance to silicon; appropriate Schottky barrier height or ohmic with heavily doped silicon (n+ or p+); thermal stability; appropriate morphology for subsequent lithography and etching; high corrosion resistance; oxidation resistance; good adhesion to and minimal reaction with $SiO_2$; low interface stress, compatible with other processing steps such as lithography and etching, minimizing metal penetration; high electro-migration resistance; and formability at low temperature. The requirements are rather stringent and at present, only three suicides, $TiSi_2$, $CoSi_2$, and $NiSi$, are being considered for metal contacts for advanced devices.

$PtSi$ and $Pd_2Si$ were used early on for metal contacts to lower the contact resistance of aluminum alloys as well as to serve as a diffusion barrier layer between aluminum alloy film and silicon. In the early 1980s, as the line-width decreased to about 1 μm, many refractory metal silicide films, such as $MoSi_2$, $WSi_2$, $TiSi_2$, and $TaSi_2$ were used by different manufacturers. For the 0.25 μm technology, $TiSi_2$ was almost used exclusively. 3 For devices with line-width of 0.18 μm or smaller, $TiSi_2$, $CoSi_2$, and $NiSi$ are possible candidate contact materials.

The usual steps to form a silicide begin with the cleaning of the wafers consecutively by organic solution, dilute hydrochloric acid (HF), and de-ionized water. The wafers are blown dry with a nitrogen gun or in a "spin-rinse-dry" process. An alternative is to dip the wafer in dilute HF then blow dry with a nitrogen gun or "spin dry." The wafers are immediately placed in the metal deposition chamber and the surface is sputter-cleaned by argon ions if necessary (argon sputtering may cause particle issue). Next, metal thin films are deposited on silicon at room temperature or at a higher temperature, and finally, the wafers are heat treated either by traditional furnace annealing or by rapid thermal annealing to form silicides.

Prior to the deposition of metal thin films, a 1.5-nm to 2-nm-thick $SiO_2$ layer was usually present at the silicon substrate surface following the etching of the thermal oxide. It is necessary for the contact metal layers to penetrate the thin oxide layer to react with the silicon to form silicides. Titanium and nickel atoms are capable of penetrating through the thin oxide. On the other hand, cobalt atoms have difficulty forming silicide with silicon if a thin oxide layer is present at the interface. An argon ion sputter-cleaning step is usually required. Since $CoSi_2$ is widely used in devices with line-widths of 0.18 μm or smaller, the formation of $CoSi_2$ is used as an example to illustrate the steps to form silicides on silicon. The deposition of cobalt thin films by sputtering is kept at room temperature. A mixture of $Co_2Si$ and $CoSi$ is formed at 300° C. $CoSi_2$ forms at 650° C. For rapid thermal annealing, the first-step and second-step annealing are conducted at 500-550° C. for 30-60 sec and 700-850° C. for 30-60 sec, respectively.

Silicidization is the process of forming a surface layer of a refractory metal silicide on silicon. A metal, today typically titanium or cobalt, is deposited on the silicon gate polysilicon and/or source drain regions and a layer of silicide (e.g., TiSi or CoSi) is formed when the two substances react at elevated temperatures.

Silicidization is a process that is also used to lower the resistance of the polysilicon interconnect and/or the source-drain contact and sheet resistances. In a "polycide" process, silicide is formed only on the polysilicon. In a "silicide" process silicide is formed on both the gate polysilicon and source-drain regions.

Silicides are widely used in semiconductor manufacturing for both logic and memory devices. On the same IC, silicides are used on different devices including both the poly on the gate regions and the source and drain. To optimize the process window or performance of different structures, it is desirable to apply different silicides with different thicknesses. However, silicide preference on the semiconductor structure are different and the present process flow can use only one metal deposition thickness as a trade-off for all devices.

Therefore, there is a need for a method for forming silicide layers using the same metal and having with different thicknesses over different areas of an IC wafer. There is also a need for a method for forming silicide layers using the different metals on different areas of an IC wafer.

SUMMARY

A device area has a gate region and active regions corresponding to the source an drain of an FET. Silicon that is used to form the channel connecting the source and drain is covered with an oxide layer that corresponds to the gate oxide. The oxide layer is coated with silicon nitride which is a diffusion stop. An opening etched in the silicon nitride and polysilicon is used to form the gate region over the gate oxide.

In one embodiment, metal is deposited over the gate region while the active area remains covered by the silicon nitride. The device is annealed at temperature and the metal layer reacts with the polysilicon to form a silicide on the gate region. The metal not forming a silicide and the nitride and oxide covering are removed exposing the silicide on the gate and the active regions. Another metal layer is deposited over the silicide on the gate region and the exposed active regions. The device is again annealed and silicide of a thickness is form by reacting the metal with the silicon of the active regions and additional silicide thickness is formed at the gate region.

In a second embodiment, metal is deposited over the exposed active regions gate region while the gate region remains covered by the silicon nitride. The device is annealed at temperature and the metal layer reacts with the exposed silicon to form a silicide on the active regions. The metal not forming a silicide and the nitride covering the gate region are removed exposing the silicide on the active regions and the gate region. Another metal layer is deposited over the silicide on the active regions and the exposed gate region. The device is again annealed and silicide of a thickness is form by reacting the metal with the polysilicon of the gate region and additional silicide thickness is formed at the active regions. In this manner, silicide of various thicknesses can be formed over different areas.

In a third embodiment, metal is deposited over the exposed active regions gate region while the gate region remains covered by the silicon nitride. The device is annealed at temperature and the metal layer reacts with the exposed silicon to form a silicide on the active regions. The metal not forming a silicide and the nitride covering the gate region are removed exposing the silicide on the active regions and the gate region. The silicide in the active regions are again covered with a barrier material. Another different second metal layer is deposited over the exposed gate region. The device is again annealed and different silicide is formed by reacting the second metal with the polysilicon of the gate region. In this manner, different silicides are formed over different areas of the IC wafer.

The foregoing has outlined rather broadly the features and technical advantages of the present invention in order that the detailed description of the invention that follows may be better understood. Additional features and advantages of the invention will be described hereinafter which form the subject of the claims of the invention

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1A:
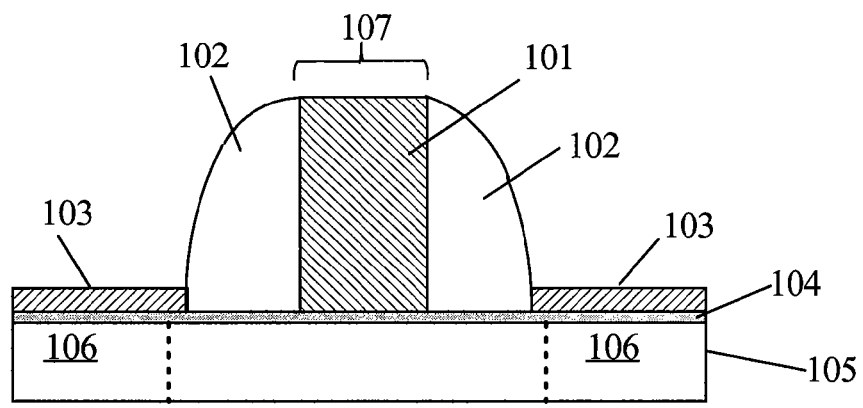
FIG. 1A illustrates a gate region of polysilicon formed over an oxide layer covering the active regions.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, data formats within communication protocols, and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views. In the following, a field effect transistor (FET) device is used to describe embodiments of the present invention. The FET has a gate region formed over a channel and active regions (source and drain) formed by doping areas silicon on either side of the channel. However, it is understood that the process steps of the present invention may be applied to other devices. For example, a resistor may be formed having a body element of doped silicon and contacts at each end of the body element. Silicides of varying thicknesses may be formed over the body and the contacts to configure the characteristics of the resistor using embodiments of the present invention.

FIG. 1A illustrates a process step for a device on an IC used in embodiments of the present invention. A silicon substrate 105 has a gate oxide layer 104 and active regions 106. A covering layer 103 (e.g., silicon nitride) is formed over the gate oxide layer 104 as a diffusion barrier. The nitride layer 103 is selectively removed exposing the oxide over a the gate area. Spacer/liner 102 is deposited and etched to from the cavity for making contact to the gate oxide. Polysilicon 101 is deposited over the gate oxide to form an conductive gate region 107.

Figure 1B:
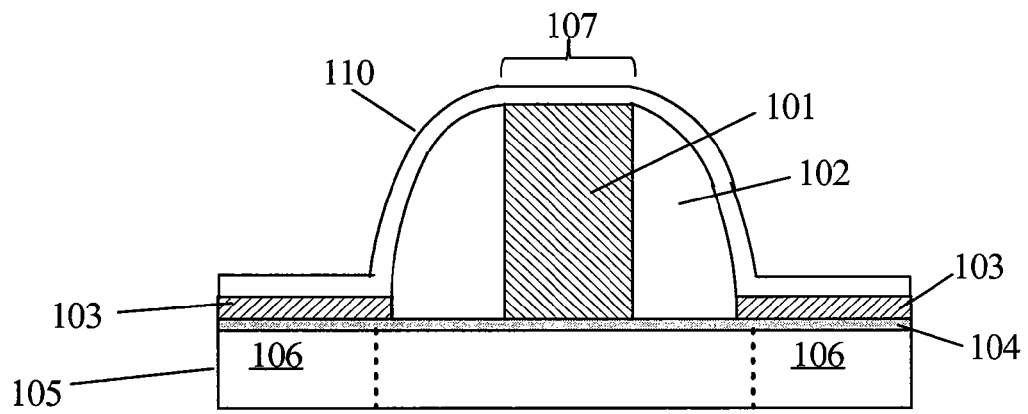
FIG. 1B illustrates metal deposited over the exposed gate region and the active areas covered with oxide and nitride layers.

FIG. 1B illustrates a process step of applying a metal (e.g., Cobalt) layer 110 over the device active regions 106 and the gate region 107. The gate polysilicon 101 is in direct contact with the Cobalt (Co) metal layer 110. At this point the device is annealed at a high temperature to react the metal with the polysilicon to form a silicide (CoSi) which has higher conductivity than polysilicon.

Figure 2A:
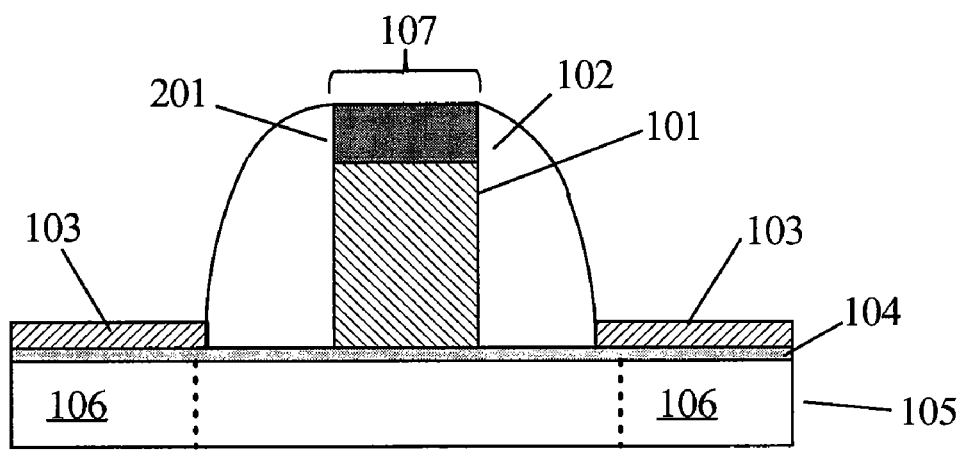
FIG. 2A illustrates the silicide thickness formed by reacting the metal and the polysilicon in the gate region.

FIG. 2A illustrates the device from FIG. 1B after annealing and removing the un-reacted metal. Silicide thickness 201 has formed on the polysilicon of the gate region 107. The nitride diffusion barrier 103 prevents any metal from reacting with the active regions 106.

Figure 2B:
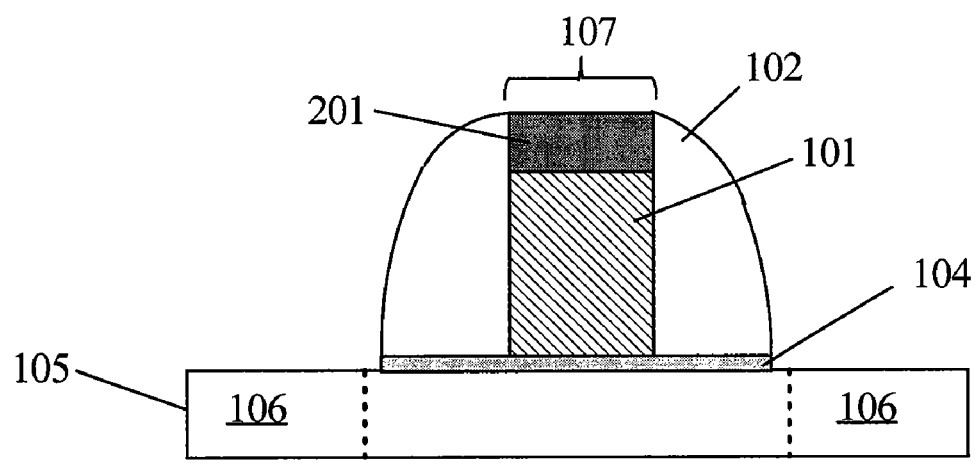
FIG. 2B illustrates the oxide and nitride removed exposing the active regions.

FIG. 2B illustrates the device of FIG. 2A after the process step of removing the nitride 103 over the active regions 106 of the device. Another step (not shown) masks the device so the oxide layer 104 over the active regions 106 may be removed.

Figure 3A:
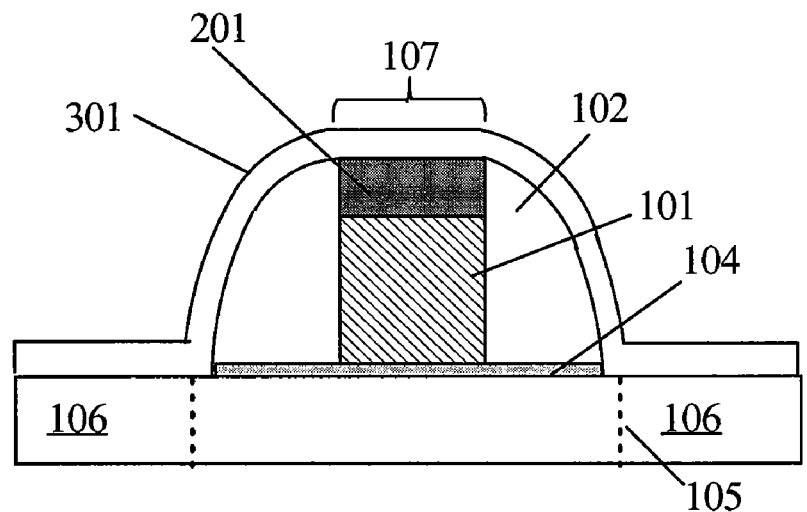
FIG. 3A illustrates an additional metal layer deposited over the exposed active regions and the silicide on the gate region.

FIG. 3A illustrates the device of FIG. 2B with the oxide 104 over the active regions 106 removed and another metal (e.g., Co) layer 301 deposited. The second Co metal layer 301 is in contact with the silicide 201 in the gate region 107 and the silicon 105 of the active regions 106. At this stage the device is again annealed and the second Co metal layer 301 reacts with the existing silicide 201 and the silicon in the active regions 106. It is understood that the silicide 201 of the gate region 107 may be again masked and metal layer 301 may be a metal different from Co (e.g., Ti). In this manner, two different silicides may be formed, one (e.g., Ti silicide) in the active regions and one (e.g., Co silicide) in the gate regions. Other combinations of metals may be used in different areas of an IC wafer using processing steps according to embodiments of the present invention to form silicides of different thicknesses and different silicides using different metals.

Figure 3B:
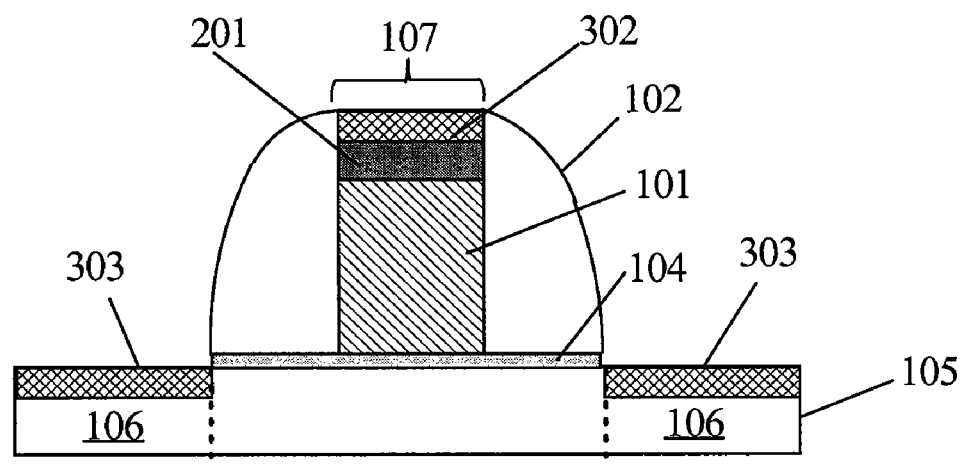
FIG. 3B illustrates one thickness of silicide formed over the active regions and additional thicker silicide formed over the gate region.

FIG. 3B illustrates the device of FIG. 3A with the un-reacted metal removed. The gate region 107 now has two thicknesses of silicide (e.g., CoSi) 201 and 302. Likewise, the active regions 106 have CoSi silicide thickness 303. In this manner different silicide thicknesses (303) and (201 plus 302) have been formed of different materials; doped silicon in the active regions 106 and polysilicon over the gate region 107.

Figure 4A:
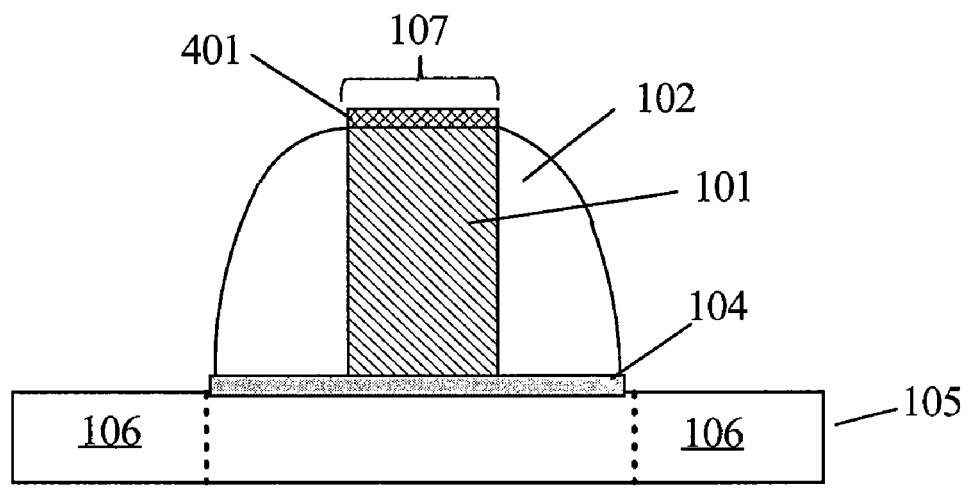
FIG. 4A illustrates the gate region covered with the nitride layer while the active regions are exposed.

FIG. 4A illustrates a process step for a device on an IC used in another embodiments of the present invention. A silicon substrate 105 has a gate oxide layer 104 and active regions 106. Spacer/liner 102 is deposited and etched to from the cavity for making contact to the gate oxide. Polysilicon 101 is deposited to form an conductive region for the gate. A nitride layer 401 is formed over the polysilicon of the gate and the oxide over the active regions is removed.

Figure 4B:
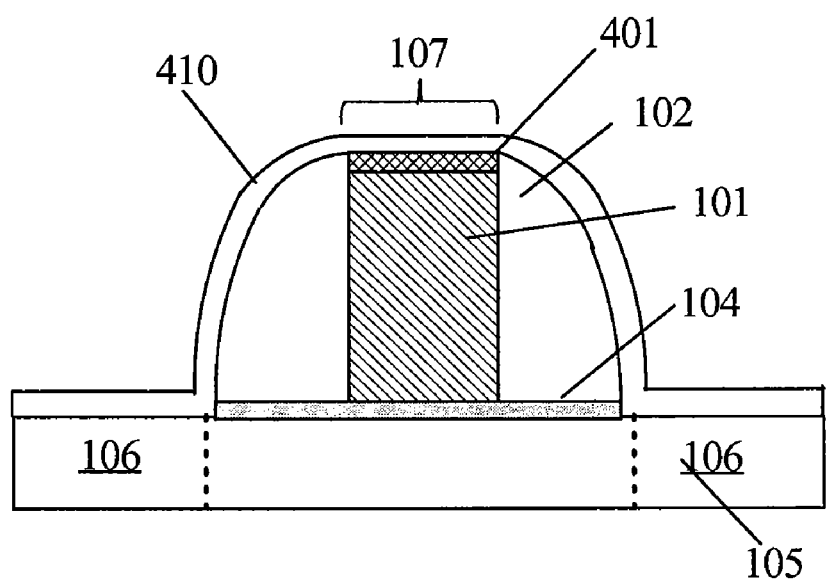
FIG. 4B illustrates metal deposited over the exposed active regions and the gate region covered with a nitride layer.

FIG. 4B illustrates the device of FIG. 4A after a metal layer (e.g., Co) 410 has been deposited over the active regions 106 and the nitride over the gate region 107. The device is annealed and the metal layer 410 reacts with the silicon in the active regions 106 but is prevented from reacting with the polysilicon in gate region 107 by the nitride layer 401.

Figure 5A:
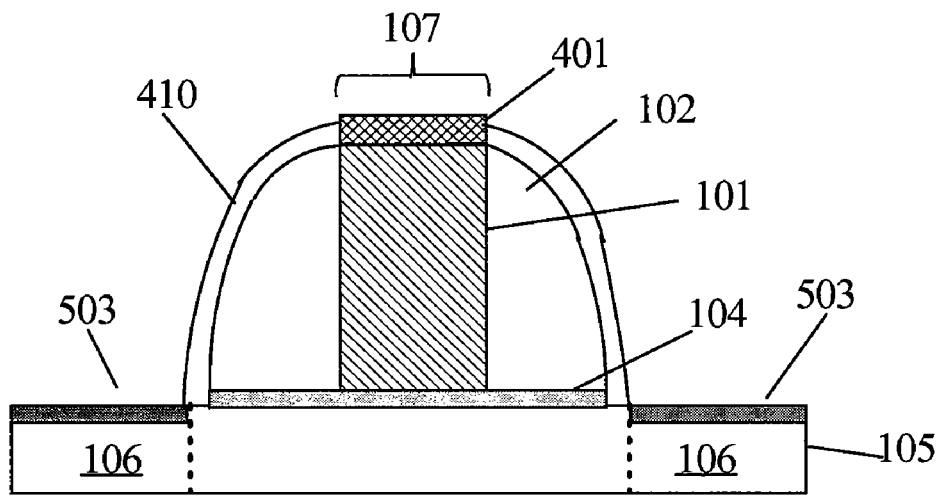
FIG. 5A illustrates the silicide thickness formed in the active regions by reacting the metal layer with the silicon in the active regions.

FIG. 5A illustrates the device of FIG. 4B after the annealing step wherein a silicide layer (CoSi) 503 is formed over the active regions 106.

Figure 5B:
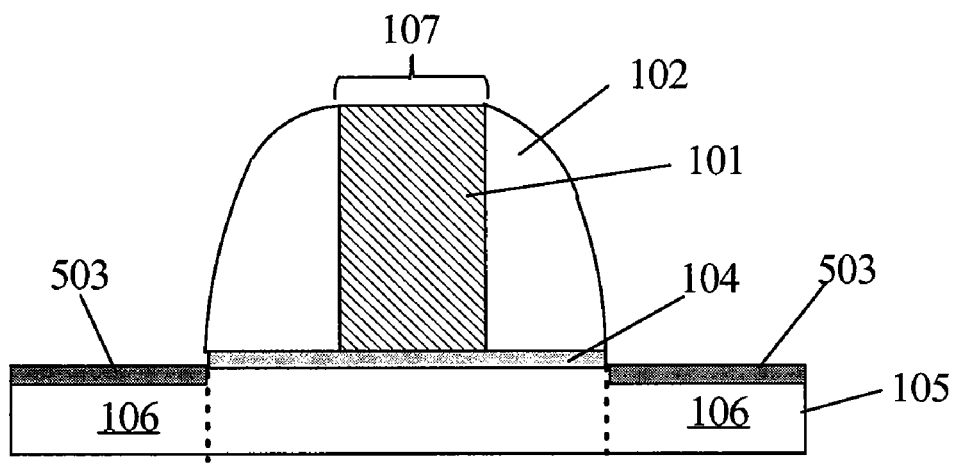
FIG. 5B illustrates the exposing the gate region and the active regions.

FIG. 5B illustrates the device of FIG. 5A with the metal layer 410 and the nitride layer 401 removed from the gate region 107.

Figure 6A:
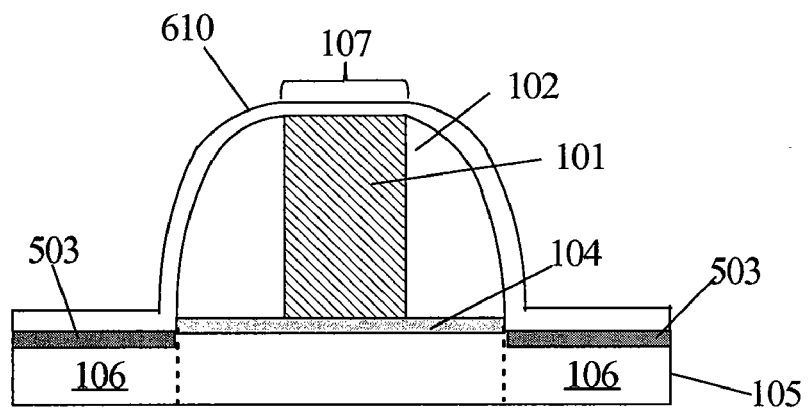
FIG. 6A illustrates another metal layer deposited over the silicide in the active regions and the exposed gate region.

FIG. 6A illustrates the device of FIG. 5B after the step of depositing a second metal layer 610 over the polysilicon of the gate region 107 and the silicide layer 503 in the active regions 106. At this step the device is again annealed reacting the metal (Co) layer 610 with the polysilicon 101 and the silicide 503 over the active regions 106. In an alternate embodiment, the active regions 106 are masked (not shown) so that the silicide layer 503 is not in contact with metal layer 610. In this case, metal layer 610 may be a second metal (e.g., Ti).

Figure 6B:
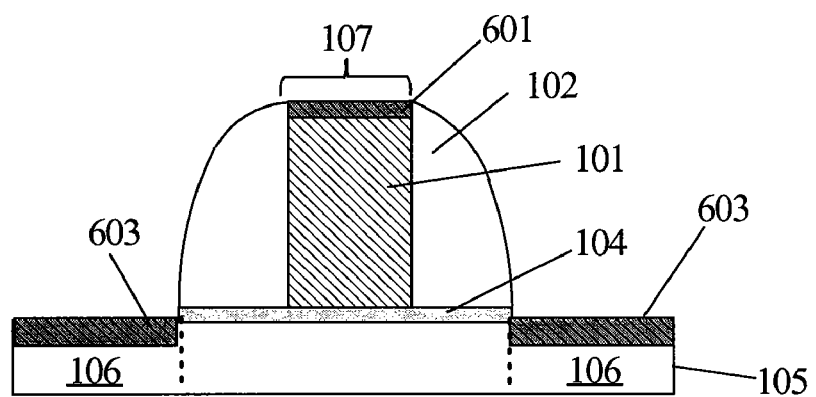
FIG. 6B illustrates one thickness of silicide formed over the gate region and additional thicker silicide formed over the active regions.

FIG. 6B illustrates the device of FIG. 6A after the un-reacted second metal 610 is removed. Silicide 601 of one thickness is formed from the polysilicon of the gate region 107 and silicide 503 (not shown) is increased to form silicide 603 of another thickness from the doped silicon of the active regions 106.

Figure 6C:
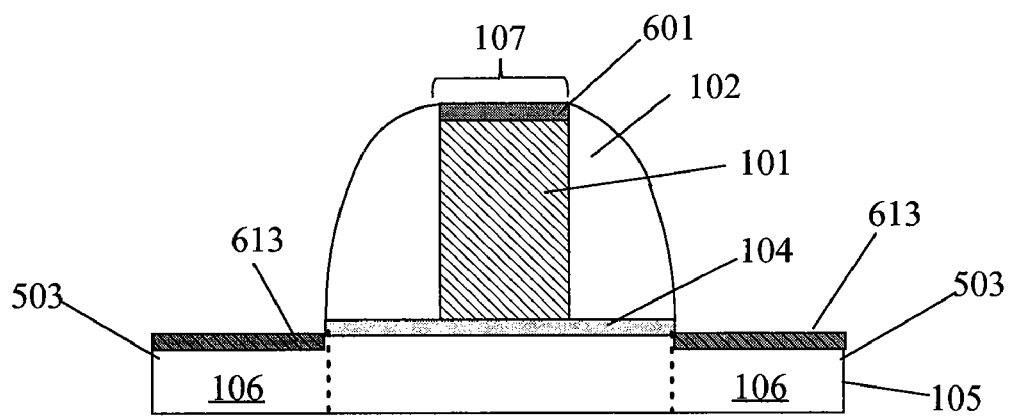
FIG. 6C illustrates the device of the alternate embodiment of FIG. 6A with two different suicides formed.

FIG. 6C illustrates the device of the alternate embodiment of FIG. 6A after the un-reacted second metal 610 is removed. A first silicide 601 of formed from the polysilicon of the gate region 107 and a second silicide 603 is formed from the doped silicon of the active regions 106 and the second metal 610. In this manner, two different suicides are formed in different areas of an IC.

Figure 7:
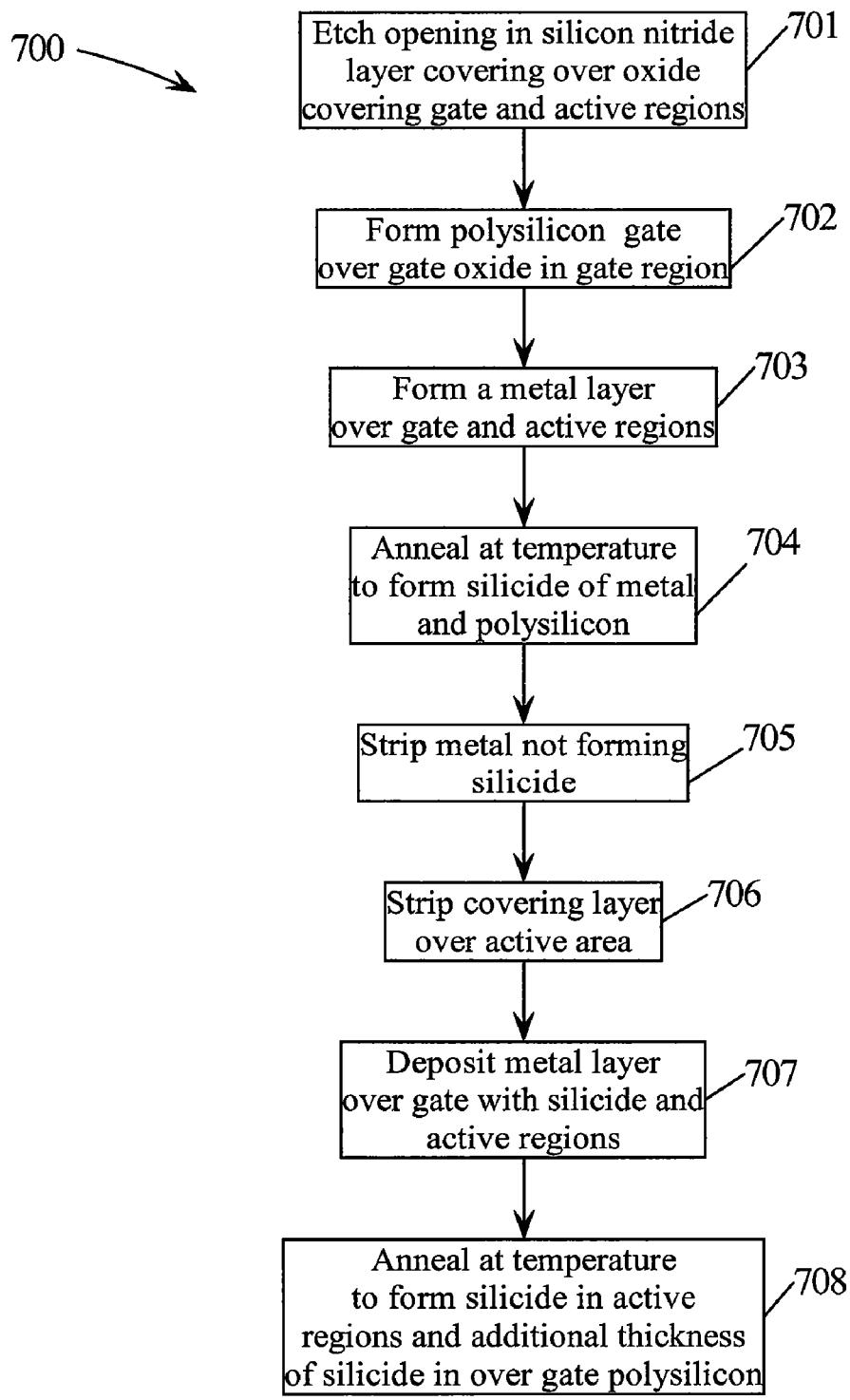
FIG. 7 is a flow diagram of method steps in one embodiment of the present invention.

FIG. 7 is a flow diagram of method steps used in a process according to embodiments of the present invention. In step 701, an opening is etched in the silicon nitride layer covering the silicon oxide covering the gate and the active areas of a device on an IC. In step 702, the polysilicon gate is formed over the gate oxide of the gate region. In step 703, a metal layer is deposited over the polysilicon of the gate region and the nitride covering the active regions. In step 704, the device is annealed to react the metal (e.g., Co) to form a silicide (CoSi) of the metal and the polysilicon of forming the contact to the gate region. In step 705, the un-reacted metal is and the nitride covering the active regions is removed. In step 706, second metal layer (Co) is deposited over the silicide on the gate region and the active areas. The device is again annealed in step 708 reacting the second metal layer with the silicide of the gate region and the doped silicon in the active areas. This process forms a first silicide of one thickness by reacting the first metal layer with polysilicon in one step and by reacting the formed first silicide with the second metal layer. A second silicide of a second thickness is formed by reacting the doped silicon in the active regions with the second metal layer.

Figure 8:
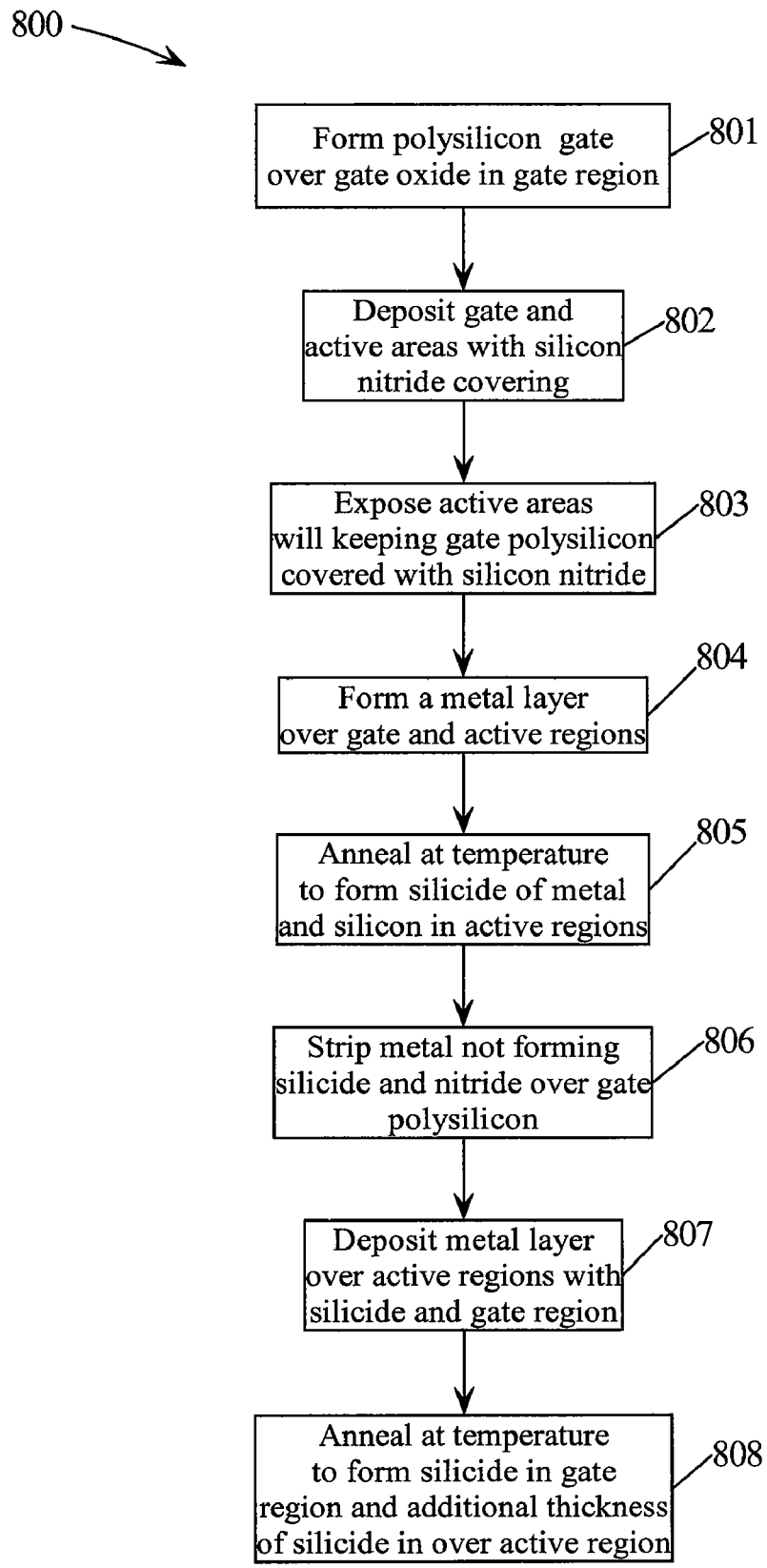
FIG. 8 is a flow diagram of method steps in another embodiment of the present invention.

FIG. 8 is a flow diagram of method steps used in a process according to another embodiment of the present invention. In step 801, a polysilicon gate is formed over the gate oxide of the gate region. In step 802, a silicon nitride layer is deposited over polysilicon gate region and the silicon oxide covering the active areas of a device on an IC. In step 803, the active areas are exposed while keeping the gate polysilicon covered with the nitride layer. In step 804, a metal layer is deposited over the nitride of the gate region and the active regions. In step 805, the device is annealed to react the metal (e.g., Co) to form a silicide (CoSi) of the metal and the doped silicon of active regions. In step 806, the un-reacted metal is and the nitride covering the gate region is removed. In step 807, second metal layer (Co) is deposited over the silicide on active regions and the polysilicon of the gate region. The device is again annealed in step 808 thereby reacting the second metal layer with the silicide of the active regions and the polysilicon in the gate region. This process forms a first silicide of a first thickness by reacting the first metal layer with doped silicon in one step and by reacting the formed first silicide with the second metal layer. A second silicide of a second thickness is formed by reacting the polysilicon in the gate region with the second metal layer.

Figure 9:
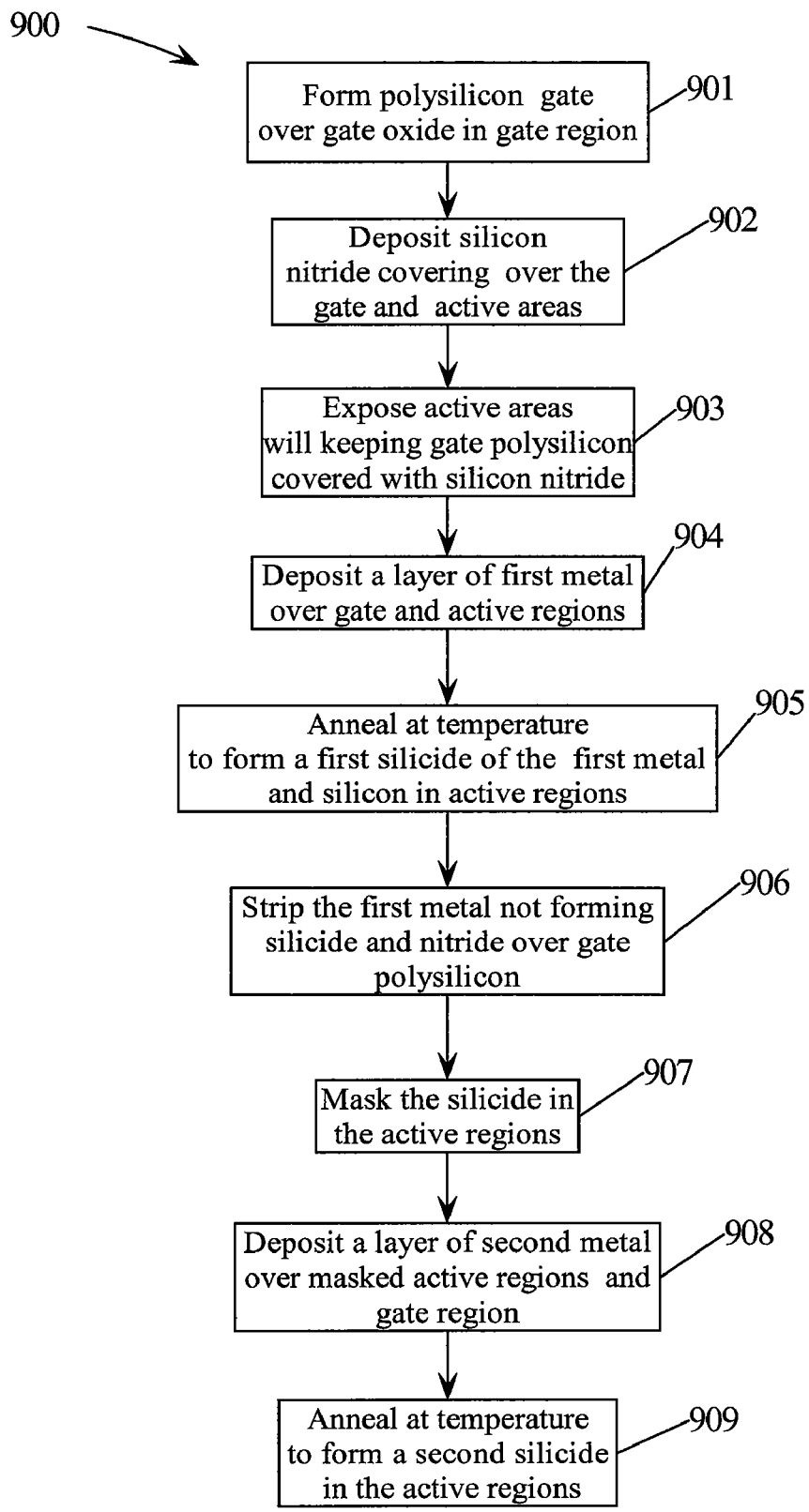
FIG. 9 is a flow diagram of method steps in another embodiment of the present invention.

FIG. 9 is a flow diagram of method steps used in a process according to another embodiment of the present invention. In step 901, a polysilicon gate is formed over the gate oxide of the gate region. In step 902, a silicon nitride layer is deposited over polysilicon gate region and the silicon oxide covering the active areas of a device on an IC. In step 903, the active areas are exposed while keeping the gate polysilicon covered with the nitride layer. In step 904, a layer of first metal is deposited over the nitride of the gate region and the active regions. In step 905, the device is annealed to react the first metal to form a first silicide of the first metal and the doped silicon of active regions. In step 906, the un-reacted first metal and the nitride covering the gate region are removed. In step 907, the active regions are again masked. In step 908, a layer of second metal is deposited over the masked active regions and the polysilicon of the gate region. The device is again annealed in step 909 thereby reacting the second metal with the polysilicon in the gate region and forming a second silicide in the gate region.

Although the present invention and its advantages have been described in detail, it should be understood that various changes, substitutions and alterations can be made herein without departing from the spirit and scope of the invention as defined by the appended claims.

What is claimed is:

1. A method of forming silicides of different thickness on different materials of a device comprising the steps of:
    forming a first region of first silicon and a second region of second silicon;
    covering the first region with a diffusion blocking layer while exposing the second region;
    depositing a first metal layer over the first and second regions;
    annealing the device a first time, thereby forming a silicide of a first thickness by reacting the first metal layer and the exposed second silicon of the second region;
    removing the blocking layer and un-reacted first metal from the first region;
    depositing a second metal layer over the first region and the first thickness of silicide of the second region; and
    annealing the device a second time, thereby forming a silicide of a second thickness by reacting the second metal layer and the exposed silicon of the first region and forming a silicide of a third thickness by reacting the second metal layer and the first thickness of silicide of the second layer;

wherein the first thickness, the second thickness, and the third thickness are each different with respect to one another.

2. The method of claim 1, wherein the device is a field effect transistor (FET) of an integrated circuit (IC) wafer.

3. The method of claim 1, wherein the device is a passive resistor device.

4. The method of claim 2, wherein the first and third silicide thicknesses form contact areas for connecting the device to other circuitry on the IC.

5. A method of forming silicides of different thickness on different materials of a device comprising the steps of:
forming a first region of first silicon and a second region of second silicon;
covering the first region with a diffusion blocking layer while exposing the second region;
depositing a first metal layer over the first and second regions;
annealing the device a first time, thereby forming a silicide of a first thickness by reacting the first metal layer and the exposed second silicon of the second region;
removing the blocking layer and un-reacted first metal from the first region;
depositing a second metal layer over the first region and the first thickness of silicide of the second region; and
annealing the device a second time, thereby forming a silicide of a second thickness by reacting the second metal layer and the exposed silicon of the first region and forming a silicide of a third thickness by reacting the second metal layer and the first thickness of silicide of the second layer;
wherein the device is a field effect transistor (FET) of an integrated circuit (IC) wafer;
wherein the first region comprises the active regions of the FET device.

6. The method of claim 5, wherein the first region comprises the drain and source of the FET device.

7. The method of claim 5, wherein the second region comprises the gate of the FET device.

8. A method of forming silicides of different thickness on different materials of a device comprising the steps of:
forming a first region of first silicon and a second region of second silicon;
covering the first region with a diffusion blocking layer while exposing the second region;
depositing a first metal layer over the first and second regions;
annealing the device a first time, thereby forming a silicide of a first thickness by reacting the first metal layer and the exposed second silicon of the second region;
removing the blocking layer and un-reacted first metal from the first region;
depositing a second metal layer over the first region and the first thickness of silicide of the second region; and
annealing the device a second time, thereby forming a silicide of a second thickness by reacting the second metal layer and the exposed silicon of the first region and forming a silicide of a third thickness by reacting the second metal layer and the first thickness of silicide of the second layer;
wherein the device is a passive resistor device;
wherein the first region comprises the body of the resistor.

9. The method of claim 8, wherein the second region(s) comprises the contacts ends of the resistor device.

10. A method of forming silicides of different metals on different areas of a device comprising the steps of:
forming a first region of first silicon and a second region of second silicon; covering the first region with a diffusion blocking layer while exposing the second region;
depositing a layer of first metal over the first and second regions;
annealing the device a first time, thereby forming a first silicide by reacting the first metal and the exposed second silicon of the second region;
removing the blocking layer and un-reacted first metal from the first region;
masking the first silicide formed in the second region;
depositing a layer of second metal over the first region and the masked first silicide of the second region; and
annealing the device a second time, thereby forming a second silicide by reacting the second metal and the exposed silicon of the first region;
wherein the device is a field effect transistor (FET) of an integrated circuit (IC) wafer;
wherein the first region comprises the active regions of the FET device.

11. The method of claim 10, wherein the first region comprises the drain and source of the FET device.

12. The method of claim 10, wherein the second region comprises the gate of the FET device.

13. The method of claim 10, wherein the first and second silicides form contact areas for connecting the device to other circuitry on the IC.

14. A method of forming silicides of different metals on different areas of a device comprising the steps of:
forming a first region of first silicon and a second region of second silicon; covering the first region with a diffusion blocking layer while exposing the second region;
depositing a layer of first metal over the first and second regions;
annealing the device a first time, thereby forming a first silicide by reacting the first metal and the exposed second silicon of the second region;
removing the blocking layer and un-reacted first metal from the first region;
masking the first silicide formed in the second region;
depositing a layer of second metal over the first region and the masked first silicide of the second region; and
annealing the device a second time, thereby forming a second silicide by reacting the second metal and the exposed silicon of the first region;
wherein the device is a passive resistor device;
wherein the first region comprises the body of the resistor.

15. The method of claim 14, wherein the second region(s) comprises the contacts ends of the resistor device.

* * * * *